United States Patent
Yamada et al.

(10) Patent No.: US 8,786,822 B2
(45) Date of Patent: Jul. 22, 2014

(54) PROJECTION OPTICAL SYSTEM WITH DEFORMABLE OPTICAL ELEMENT, EXPOSURE APPARATUS, AND DEVICE MANUFACTURING METHOD

(75) Inventors: Akihiro Yamada, Utsunomiya (JP); Atsushi Shigenobu, Utsunomiya (JP); Tsuyoshi Kitamura, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 731 days.

(21) Appl. No.: 12/710,246

(22) Filed: Feb. 22, 2010

(65) Prior Publication Data
US 2010/0214546 A1 Aug. 26, 2010

(30) Foreign Application Priority Data
Feb. 25, 2009 (JP) ................. 2009-042437

(51) Int. Cl.
G03B 27/68 (2006.01)
(52) U.S. Cl.
USPC .......................................... 355/52
(58) Field of Classification Search
USPC .................................... 355/52, 55, 67, 53
See application file for complete search history.

(56) References Cited

U.S. PATENT DOCUMENTS

| 5,607,216 | A | * | 3/1997 | Kaneko et al. ............ 353/97 |
| 6,388,823 | B1 | | 5/2002 | Gaber |
| 2006/0232866 | A1 | | 10/2006 | Sai |
| 2008/0310029 | A1 | | 12/2008 | Conradi |

FOREIGN PATENT DOCUMENTS

| JP | 08-008178 A | 1/1996 |
| JP | 10-039208 A | 2/1998 |
| JP | 2002-519843 T | 7/2002 |
| JP | 2005-311020 A | 11/2005 |
| JP | 2006-191062 A | 7/2006 |
| JP | 2006-295023 A | 10/2006 |
| JP | 2008-546007 T | 12/2008 |

* cited by examiner

*Primary Examiner* — Chia-how Michael Liu
(74) *Attorney, Agent, or Firm* — Canon USA, Inc. IP Division

(57) ABSTRACT

A system includes a plurality of optical elements, a deformation unit configured to deform a deformable optical element satisfying a following conditional formula included in the plurality of optical elements by applying a force to the deformable optical element:

$$0.75 < EA/EA0 < 0.95$$

where $EA0$ represents an effective aperture of each of the plurality of optical elements and $EA$ represents an axial light flux diameter of each of the plurality of optical elements, and a control unit configured to control the deformation unit, wherein n positions on an outer circumference of the deformable optical element are fixed, the deformation unit includes n actuators, the n actuators apply forces to n positions on the outer circumference other than the fixed n positions, and the control unit controls each of the n actuators independently.

14 Claims, 10 Drawing Sheets

PROJECTION OPTICAL SYSTEM WITH DEFORMABLE OPTICAL ELEMENT, EXPOSURE APPARATUS, AND DEVICE MANUFACTURING METHOD

BACKGROUND OF THE INVENTION

1. Field of the Invention

The present invention relates to a projection optical system, an exposure apparatus, and a device manufacturing method.

2. Description of the Related Art

To improve resolution, a double patterning technique is proposed. The double patterning technique is a technique for dividing a fine pattern which cannot be resolved by one time exposure so that the fine pattern can be resolved, and separately exposing the divided patterns.

Since a plurality of exposures are required to obtain a desired pattern, a use of the double patterning technique causes a decrease in device productivity. Therefore, productivity improvement is required for an exposure apparatus using the double patterning technique. To improve productivity of the exposure apparatus, the power of an exposure light source may be increased. However, when the power of the exposure light source is increased, an exposure load imposed on the exposure apparatus also increases. Especially, when an exposure load is applied to a projection optical system, there occurs a refractive-index change of an optical element included in the projection optical system, or a surface shape deformation of the optical element, by an exposure heat. As a result, an aberration of the projection optical system changes, and an imaging performance of the projection optical system deteriorates.

Therefore, it is proposed to correct the aberration (exposure aberration) of the projection optical system caused by the exposure load by driving the optical element included in the projection optical system in an optical axis direction, or tilting the optical element relative to the optical axis. In Japanese Patent Application National Publication (Laid-Open) No. 2002-519843, a method is discussed in which the exposure aberration is corrected by deforming the optical element included in the projection optical system. The exposure aberration is corrected by arranging a plurality of piezoelectric elements around a lens and deforming the lens by the piezoelectric elements. In Japanese Patent Application Laid-Open No. 10-039208, a method is discussed in which an aberration due to manufacturing errors is corrected by deforming a lens near an aperture stop of the projection optical system or a lens near a surface of an object. In Japanese Patent Application National Publication (Laid-Open) No. 2008-546007, a method is discussed in which a higher-order aberration is corrected by deforming a lens in the projection optical system.

In recent years, a higher-order asymmetrical aberration in the pupil of the projection optical system (higher-order in-pupil asymmetrical aberration) that depends on a position in a field of view (that depends on an image height) is not ignorable. When the higher-order in-pupil asymmetrical aberration is large, overlay accuracy deteriorates. The higher-order in-pupil asymmetrical aberration is an aberration of $(2m-1)$-fold rotational symmetry ($m \geq 4$) in the pupil of the projection optical system.

By driving the lens in the optical axis direction or tilting the lens as in conventional techniques, only a low-order aberration can be corrected. By deforming the lens near the aperture stop as in Japanese Patent Application National Publication (Laid-Open) No. 2002-519843 and Japanese Patent Application Laid-Open No. 10-039208, the higher-order aberration can be corrected. However, the correction is limited to an aberration component independent of the image height. Further, only an aberration component corresponding to the deformation component applied to the lens can be corrected. By deforming the lens near the surface of the object as in Japanese Patent Application Laid-Open No. 10-039208, only a distortion or a field curvature can be mainly corrected. Although, in Japanese Patent Application National Publication (Laid-Open) No. 2008-546007, a higher-order aberration is corrected, a plurality of lenses are deformed to control rates of a plurality of aberrations to be corrected. When deforming a plurality of lenses, a severe accuracy of deformation is required and a lens barrel structure of the projection optical system becomes complex.

SUMMARY OF THE INVENTION

According to an aspect of the present invention, a system includes a plurality of optical elements, a deformation unit configured to deform a deformable optical element satisfying a following conditional formula included in the plurality of optical elements by applying a force to the deformable optical element:

$$0.75 < EA/EA0 < 0.95$$

where EA0 represents an effective aperture of each of the plurality of optical elements and EA represents an axial light flux diameter of each of the plurality of optical elements, and a control unit configured to control the deformation unit, wherein n positions on an outer circumference of the deformable optical element are fixed, the deformation unit includes n actuators, the n actuators apply forces to other n positions on the outer circumference, and the control unit controls each of the n actuators independently.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
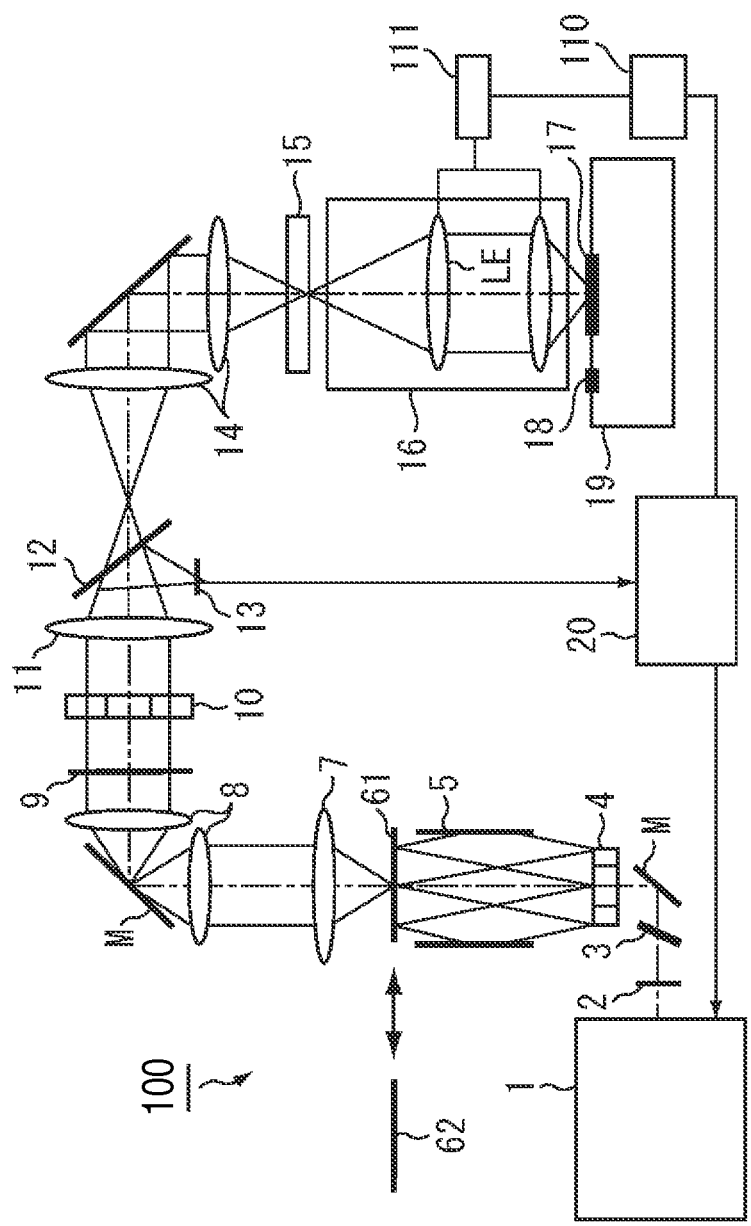
FIG. 1 is a view of an exposure apparatus according to an exemplary embodiment of the present invention.

FIG. 1 is a view of an exposure apparatus 100 according to an exemplary embodiment of the present invention.

The exposure apparatus 100 includes an exposure light source 1, an illumination optical system, a projection optical system 16, and a wafer stage 19. The illumination optical system illuminates a reticle 15 with exposure light from the exposure light source 1. The projection optical system 16 projects a pattern image of the reticle (first object) 15 as an original plate onto a wafer (second object, substrate) 17. The wafer stage 19 holds and moves the wafer 17. A resist is coated on the wafer 17 as a photosensitive substrate.

The illumination optical system includes a plane parallel plate 2, a dark filter 3, a micro lens array 4, an optical rod 5, computer-generated holograms 61 and 62, a condenser lens 7, a variable magnification relay optical system 8, a phase plate 9, a fly-eye lens 10, a condenser lens 11, and a relay optical system 14. The illumination optical system also includes a half mirror 12 and an illuminometer 13. An exposure amount control unit 20 controls an exposure amount by monitoring the illuminometer 13 based on the ratio between an output of an illuminometer 18 arranged on the wafer stage 19 and an output of the illuminometer 13.

The projection optical system 16 includes a plurality of optical elements (lenses) and a projection optical system control unit 111.

An optical element satisfying the following conditional formula (I) is assumed to be a deformable optical element (adaptive optics) LE included in a plurality of optical elements constituting the optical projection optical system 16:

$$0.75 < EA/EA0 < 0.95 \quad (1)$$

where EA0 represents an effective aperture of each of the plurality of optical elements and EA represents an axial light flux diameter of each of the plurality of optical elements. The axial light flux diameter is a diameter at which the light flux emitted from the center of an effective area of the surface of the object (for example, the optical axis) passes through the optical element.

In an outer circumference portion of the deformable optical element LE, n actuators as a deformation unit for deforming the deformable optical element LE are arranged in the same pitch of 360/n degrees in a circumference direction. The n actuators are configured to be able to deform the deformable optical element LE into n-fold rotational symmetry by applying a force to the outer circumference of the deformable optical element LE. The other n portions of the outer circumference portion of the deformable optical element LE are fixed so that the entire deformable optical element LE does not move when a force is applied to the outer circumference of the deformable optical element LE. Each of the fixed n portions is located in the center between the adjacent actuators, and arranged in the same pitch of 360/n degrees.

A projection optical system control unit 111 controls the actuators to deform the deformable optical element LE, so that the projection optical system control unit 111 reduces the aberration of the projection optical system. An exposure apparatus control unit 110 controls the exposure amount control unit 20 and the projection optical system control unit 111.

Next, the conditional formula (1) will be described. First, consider a case in which an optical element located at a position where EA/EA0 value is 0.75 or less is deformed. In this case, since a light flux passing through the optical element is small, it is difficult to correct a higher-order aberration in a desired pupil. In addition, since a main light beam of the light flux emitted from a plurality of image heights on the surface of the object excessively varies when passing through the optical element, undesirable high-order distortion is largely generated when the optical element is deformed.

Consider a case in which an optical element located at a position where EA/EA0 value is 0.95 or more is deformed into n-fold rotational symmetry. In this case, only an aberration independent of the image height, which is an aberration of the same n-fold rotational symmetry as that of the deformation in the pupil, can be corrected. Therefore, the higher-order in-pupil asymmetrical aberration that depends on an image height generated by the exposure load on the projection optical system cannot be corrected.

Consider a case in which an optical element arranged at a position where the conditional formula (1) is satisfied is deformed into n-fold rotational symmetry. Since the light flux which is emitted from each image height of the surface of the object and passes through the optical element has a considerable size for the effective aperture of the optical element, the higher-order aberration can be efficiently corrected. Further, since the main light beam of the light flux emitted from a plurality of image heights on the surface of the object does not vary so much, generation of undesirable high-order distortion is small. On the other hand, since the light flux emitted from the plurality of image heights on the surface of the object properly varies, an aberration that depends on the image heights can be generated. Specifically, when the optical element is deformed into n-fold rotational symmetry, an aberration which is n-fold rotational symmetry in the pupil and does not depend on the image height can be corrected. At the same time, it is possible to correct an aberration which is (n−1)-fold rotational symmetry in the pupil and depends on the image height and an aberration which is (n+1)-fold rotational symmetry in the pupil and depends on the image height.

Here, consider a case of n=4. In the case of n=4, it is possible to correct not only a component independent of the image height of a 4-fold rotational symmetry aberration in the pupil (4θ component), but also a component that depends on the image height of a 3-fold rotational symmetry aberration in the pupil (3θ component) and a component that depends on the image height of a 5-fold rotational symmetry aberration in the pupil (5θ component). In this way, by arranging an even number of deformation portions of the deformable optical element (portions for arranging actuators), three aberration components can be corrected. The three aberration components are a component independent of the image height of an n-fold rotational symmetry aberration in the pupil, a higher-order asymmetrical component that depends on the image height of an (n−1)-fold rotational symmetry aberration in the pupil, and a higher-order asymmetrical component that depends on the image height of an (n+1)-fold rotational symmetry aberration in the pupil.

The n actuators for applying external forces to the deformable optical element LE are configured to be controlled independently so that the actuators can deform the deformable optical element LE by different amounts of deformation from one another. When the amounts of deformation by the n actuators are the same, rates of generation amounts of each aberration component in the pupil (n-fold rotational symmetry aberration, (n−1)-fold rotational symmetry aberration, (n+1)-fold rotational symmetry aberration) are always the same. However, by independently controlling the n actuators applying external forces to the deformable optical element LE to deform the deformable optical element LE by different amounts of deformation from one another, it is possible to change rates of generation amounts of each aberration component.

Figure 2:
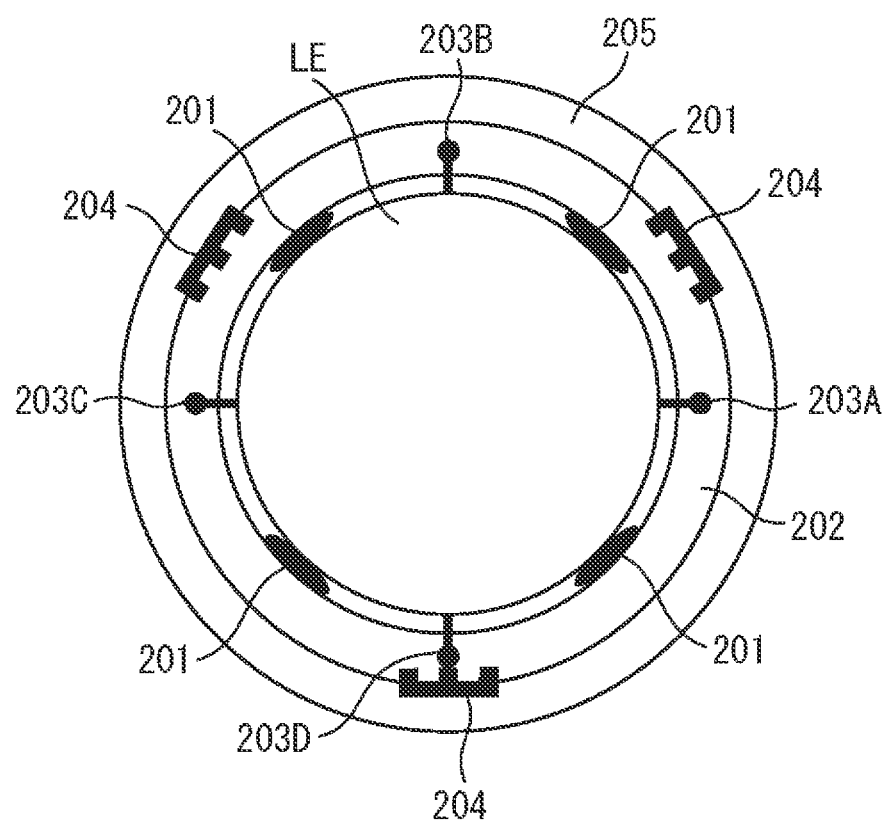
FIG. 2 is a view of a deformable optical element according to an exemplary embodiment of the present invention.

FIG. 2 is a view of a deformable optical element LE according to an exemplary embodiment of the present invention. Actuators 203A to 203D as drive units are arranged at four positions on the outer circumference of the deformable optical element LE in 90 degrees pitch. An internal holding member 202 is held inside an external holding member 205, and the internal holding member 202 holds and fixes the deformable optical element LE by four fixing portions 201. Elastic members 204 are arranged at a plurality of positions between the internal holding member 202 and the external holding member 205. The elastic members 204 absorb deformation in the radius direction of the deformable optical element LE, and have high rigidity in the optical axis direction and the tangential direction. A spring can be used as the elastic member 204. The actuators 203A to 203D are arranged at four positions in the circumferential direction of the internal holding member 202, and configured to apply a desired deformation or a desired load to the deformable optical element LE.

Figure 3:
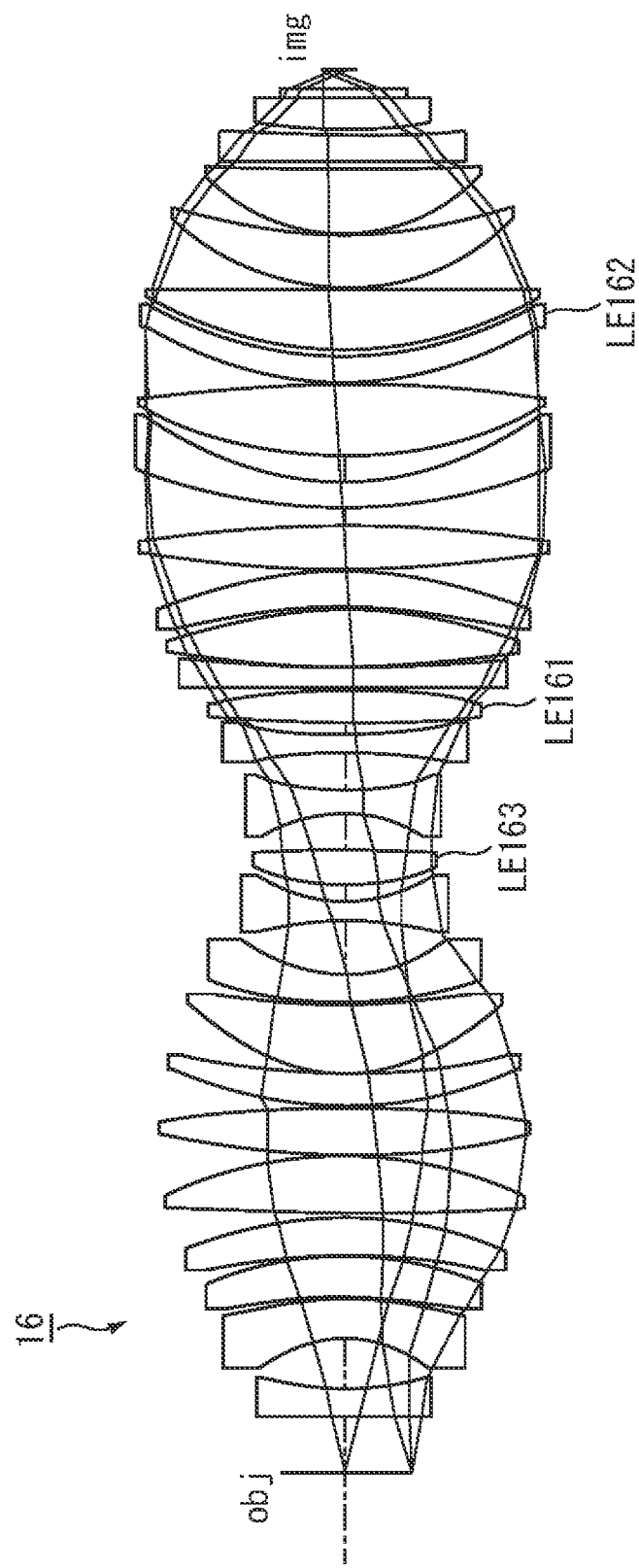
FIG. 3 is a view of a projection optical system according to an exemplary embodiment of the present invention.

FIG. 3 illustrates the optical projection system 16 according to a first exemplary embodiment of the present invention. Table 1 illustrates the specification of the optical projection system 16 according to the present exemplary embodiment, and table 2 illustrates shapes of aspherical surfaces of the optical projection system 16. The shape of aspherical surface is assumed to be represented by the following formula (2).

$$X = (L^2/4)/(1+((1-(1+k)\cdot(L/r)^2))^{1/2}) + AL^4 + BL^6 + CL^8 + DL^{10} + EL^{12} + FL^{14} + GL^{16} + HL^{20} \quad (2)$$

Here, X is an amount of deformation from the lens top in the optical axis direction, L is a distance from the optical axis, k is a conic constant, and A, B, C, D, E, F, G, and H are aspherical coefficients. NA (numerical aperture) of the projection optical system 16 is 0.93, magnification is ¼, and the maximum image height is 52 mm. Actually, an effective area (slit area) having a slit-like shape of 12 mm×8 mm on the image plane side is used. As the material of the optical element, only quartz is used. Here, it is assumed that Young's modulus of the quartz is 70 GPa, modulus of rigidity is 30 GPa, and Poisson's ratio is 0.18.

TABLE 1

| Surface number | Curvature | Distance | Effective aperture (EA0) | Refractive index | Axial light flux diameter (EA) | EA/EAO |
|---|---|---|---|---|---|---|
| OBJ | 0 | 48.946 | | | | |
| 1 | ∞ | 25.461 | 125.8 | 1.5603 | 23.4 | 0.19 |
| 2 | Aspheric | 46.581 | 135.6 | | 31.3 | 0.23 |
| 3 | −111.742 | 34.191 | 143.9 | 1.5603 | 55.8 | 0.39 |
| 4 | −423.351 | 1.584 | 195.4 | | 75.7 | 0.39 |
| 5 | −505.000 | 35.500 | 199.8 | 1.5603 | 77.2 | 0.39 |
| 6 | −300.000 | 1.470 | 224.0 | | 95.2 | 0.43 |
| 7 | Aspheric | 39.651 | 238.5 | 1.5603 | 97.8 | 0.41 |
| 8 | −284.909 | 3.322 | 255.4 | | 114.3 | 0.45 |
| 9 | 2494.482 | 51.938 | 284.4 | 1.5603 | 119.3 | 0.42 |
| 10 | −341.025 | 1.000 | 290.9 | | 132.6 | 0.46 |
| 11 | 613.702 | 42.693 | 298.9 | 1.5603 | 135.3 | 0.45 |
| 12 | −912.137 | 1.000 | 297.9 | | 138.0 | 0.46 |
| 13 | 357.500 | 28.500 | 284.1 | 1.5603 | 138.3 | 0.49 |
| 14 | 550.500 | 1.000 | 275.6 | | 135.2 | 0.49 |
| 15 | 162.786 | 63.558 | 253.2 | 1.5603 | 134.6 | 0.53 |
| 16 | 765.278 | 1.000 | 239.6 | | 116.7 | 0.49 |
| 17 | 312.032 | 25.575 | 219.9 | 1.5603 | 114.8 | 0.52 |
| 18 | 131.158 | 51.325 | 171.2 | | 101.6 | 0.59 |
| 19 | Aspheric | 15.000 | 165.9 | 1.5603 | 93.9 | 0.57 |
| 20 | 117.407 | 15.774 | 145.8 | | 94.4 | 0.65 |
| 21 | 176.136 | 32.622 | 147.9 | 1.5603 | 102.0 | 0.69 |
| 22 | −2103.050 | 34.114 | 145.8 | | 105.0 | 0.72 |
| 23 | −128.114 | 18.860 | 142.2 | 1.5603 | 108.7 | 0.76 |
| 24 | Aspheric | 35.458 | 159.0 | | 125.9 | 0.79 |
| 25 | −452.384 | 15.321 | 172.4 | 1.5603 | 150.1 | 0.87 |
| 26 | Aspheric | 11.923 | 201.0 | | 176.8 | 0.88 |
| 27 | 1051.737 | 30.289 | 213.8 | 1.5603 | 197.5 | 0.92 |
| 28 | −512.218 | 1.215 | 227.0 | | 213.5 | 0.94 |
| 29 | 15347.032 | 16.965 | 249.3 | 1.5603 | 234.5 | 0.94 |
| 30 | Aspheric | 1.000 | 271.0 | | 256.1 | 0.95 |
| 31 | 716.962 | 53.070 | 283.5 | 1.5603 | 268.1 | 0.95 |
| 32 | Aspheric | 1.000 | 291.5 | | 279.6 | 0.96 |
| 33 | −600.000 | 34.000 | 299.7 | 1.5603 | 287.7 | 0.96 |
| 34 | −350.000 | 1.000 | 310.9 | | 300.2 | 0.97 |
| 35 | 846.041 | 40.168 | 338.4 | 1.5603 | 329.5 | 0.97 |
| 36 | −1111.682 | 9.686 | 340.0 | | 331.8 | 0.98 |
| 38 | 458.671 | 23.532 | 345.0 | 1.5603 | 341.1 | 0.99 |
| 39 | 251.815 | 23.930 | 332.5 | | 331.0 | 1.00 |
| 40 | 348.462 | 68.221 | 335.8 | 1.5603 | 335.5 | 1.00 |
| 41 | −1031.757 | 1.000 | 336.3 | | 336.3 | 1.00 |
| 42 | 313.000 | 24.000 | 336.8 | 1.5603 | 331.7 | 0.98 |
| 43 | 305.500 | 5.675 | 327.3 | | 321.2 | 0.98 |
| 44 | 320.991 | 54.717 | 327.3 | 1.5603 | 321.0 | 0.98 |

TABLE 1-continued

| Surface number | Curvature | Distance | Effective aperture (EA0) | Refractive index | Axial light flux diameter (EA) | EA/EAO |
|---|---|---|---|---|---|---|
| 45 | 33665.426 | 1.000 | 323.2 | | 315.6 | 0.98 |
| 46 | 196.248 | 49.658 | 284.1 | 1.5603 | 274.7 | 0.97 |
| 47 | Aspheric | 1.000 | 273.0 | | 260.2 | 0.95 |
| 48 | 158.574 | 57.110 | 232.0 | 1.5603 | 222.1 | 0.96 |
| 49 | Aspheric | 7.674 | 215.2 | | 198.6 | 0.92 |
| 50 | −6101.427 | 24.227 | 202.5 | 1.5603 | 181.1 | 0.89 |
| 51 | Aspheric | 6.277 | 163.8 | | 143.0 | 0.87 |
| 52 | 480.622 | 29.446 | 139.4 | 1.5603 | 118.9 | 0.85 |
| 53 | 9199.201 | 1.035 | 103.1 | | 80.3 | 0.78 |
| 54 | ∞ | 6.300 | 98.7 | 1.5603 | 75.5 | 0.77 |
| 55 | ∞ | 13.081 | 89.5 | | 66.2 | 0.74 |

TABLE 2

| | Surface number | | | |
|---|---|---|---|---|
| | 2 | 7 | 19 | 24 |
| Curvature | 198.36534 | −838.44085 | −205.50981 | 218.76473 |
| K | −2.24520E−01 | 3.99083E+00 | −5.66217E−01 | 1.13378E−01 |
| A | −1.40548E−07 | −9.76753E−09 | 5.42098E−08 | −4.01468E−10 |
| B | 5.19899E−12 | 8.81069E−14 | −1.46786E−12 | −5.13611E−12 |
| C | −3.31392E−16 | −7.72611E−19 | 1.66505E−16 | 2.80838E−16 |
| D | 6.71680E−20 | 1.47415E−22 | −9.30954E−21 | −3.28219E−21 |
| E | −1.62257E−23 | −8.02034E−27 | 7.38751E−25 | 3.38672E−25 |
| F | 3.08879E−27 | 3.75776E−31 | −1.33124E−28 | −1.01780E−28 |
| G | −3.48296E−31 | −1.06149E−35 | 1.20823E−32 | 3.10106E−33 |
| H | 1.70415E−35 | 1.15274E−40 | −3.88672E−37 | 4.83795E−37 |

| | Surface number | | |
|---|---|---|---|
| | 26 | 30 | 32 |
| Curvature | 507.36563 | 1058.38426 | −383.55203 |
| K | 1.23459E+00 | −6.04317E−01 | −3.49756E−02 |
| A | 3.91766E−08 | −1.79007E−10 | 8.32441E−11 |
| B | −8.10736E−13 | 1.94704E−14 | 3.59713E−15 |
| C | −3.93621E−17 | 3.51828E−18 | 1.99109E−19 |
| D | −6.96821E−22 | 6.58322E−23 | −8.82252E−24 |
| E | 1.16531E−25 | 1.01882E−27 | −5.51351E−28 |
| F | −2.69900E−30 | −6.12566E−32 | −2.05656E−32 |
| G | 6.69558E−34 | −2.03960E−36 | −1.21552E−36 |
| H | −3.94227E−38 | 3.78213E−41 | 0.00000E+00 |

| | Surface number | | |
|---|---|---|---|
| | 47 | 49 | 51 |
| Curvature | 524.68948 | 2220.42011 | 1084.66802 |
| K | −2.80504E−01 | 4.10132E+01 | −3.18709E+00 |
| A | 1.28718E−08 | −3.36802E−10 | −2.38078E−09 |
| B | 1.70232E−14 | 1.35173E−12 | 4.24502E−13 |
| C | −5.21521E−18 | −1.23812E−16 | −8.30272E−18 |
| D | 1.73255E−23 | 9.39593E−21 | 1.67543E−21 |
| E | −7.86116E−27 | −4.01922E−25 | −7.46122E−26 |
| F | −1.60855E−31 | 8.87642E−30 | −1.10520E−28 |
| G | −4.35230E−36 | 3.13977E−35 | 1.78270E−32 |
| H | 1.85715E−40 | −2.02129E−39 | −7.62526E−37 |

As illustrated in FIG. 2, actuators are arranged in four directions around the outer circumference of the deformable optical element LE161 illustrated in FIG. 3, and the lens can be deformed into 4-fold rotational symmetry by applying an external force. The longitudinal direction of the slit area of the projection optical system 16 and a line connecting the actuators 203A and 203C in FIG. 2 are set to be the same direction.

Figure 4:
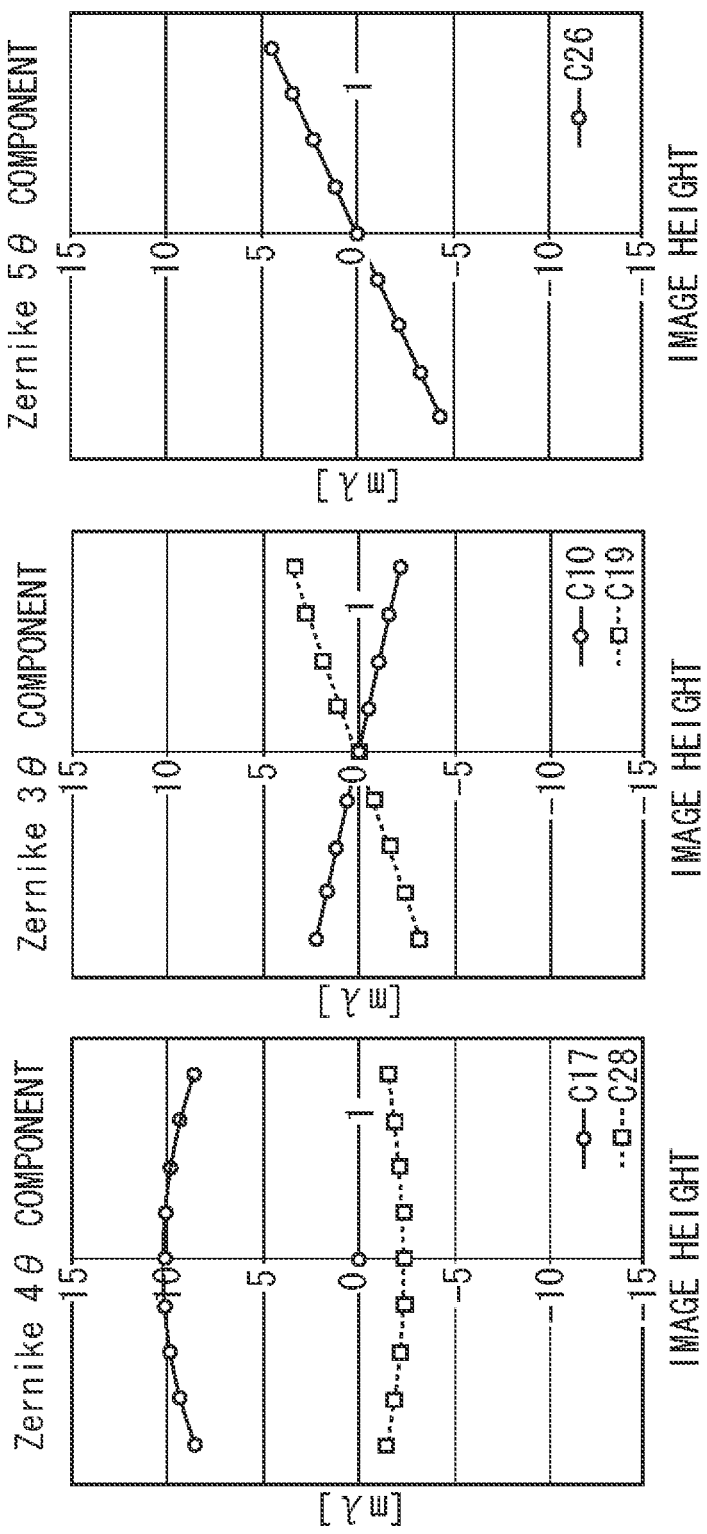
FIG. 4 is a view illustrating aberrations of the projection optical system which change when four actuators apply the same force to deform a first deformable optical element.

First, consider the deformable optical element LE161. The deformable optical element LE161 is arranged at a position where EA/EA0 value is 0.94, and the formula (1) is satisfied. FIG. 4 illustrates aberration change amounts when a force of 2.1 N is applied to each point by the four actuators 203A to 203D and the deformable optical element LE161 is deformed into 4-fold rotational symmetry. Here, the force of the actuators 203A to 203D in the direction from the image plane "img" of the projection optical system to the object "obj" is defined as "plus" and the force from the object surface "obj" to the image plane "img" is defined as "minus." The actuators 203A to 203D apply a force to a position 2.5 mm outer from the effective aperture of the LE161. In each graph in FIG. 4, the horizontal axis represents the image height, and the vertical axis represents Zernike aberration. Here, the Zernike aberration is each coefficient which is an aberration change amount in the pupil fitted by a Zernike polynomial. The Zernike polynomial is a polynomial which uses polar coordinate (R, θ) as a coordinate system and a fringe Zernike cylinder function as an orthogonal function system. The aberration change amount W (R, θ) is represented by the following formula (3).

$$W(R,\theta) = \Sigma Ci \cdot Zi \quad (3)$$

Here, Ci is a coefficient of each term of the Zernike polynomial. Zi is a cylinder function. The three graphs illustrate respectively a 3θ component of 3-fold rotational symmetry in a Zernike aberration pupil, a 4θ component of 4-fold rotational symmetry, and a 5θ component of 5-fold rotational symmetry.

When the deformable optical element LE161 is deformed into 4-fold rotational symmetry, higher-order symmetrical aberration components of the same image height of the 4-fold rotational symmetry component aberrations C17, C28 in the pupil have changed. Also, the higher-order asymmetrical aberration components of the image height primary component of the 3-fold rotational symmetry component aberrations C10, C19 in the pupil have changed. Further, the higher-order asymmetrical aberration component of the image height primary component of the 5-fold rotational symmetry component C26 in the pupil has changed. As described above, by deforming the deformable optical element LE161 into 4-fold rotational symmetry, it is possible to correct the same image height component of the 4θ component in the pupil, the image height primary component of the 3θ component in the pupil, and the image height primary component of the 5θ component in the pupil.

Figure 5:
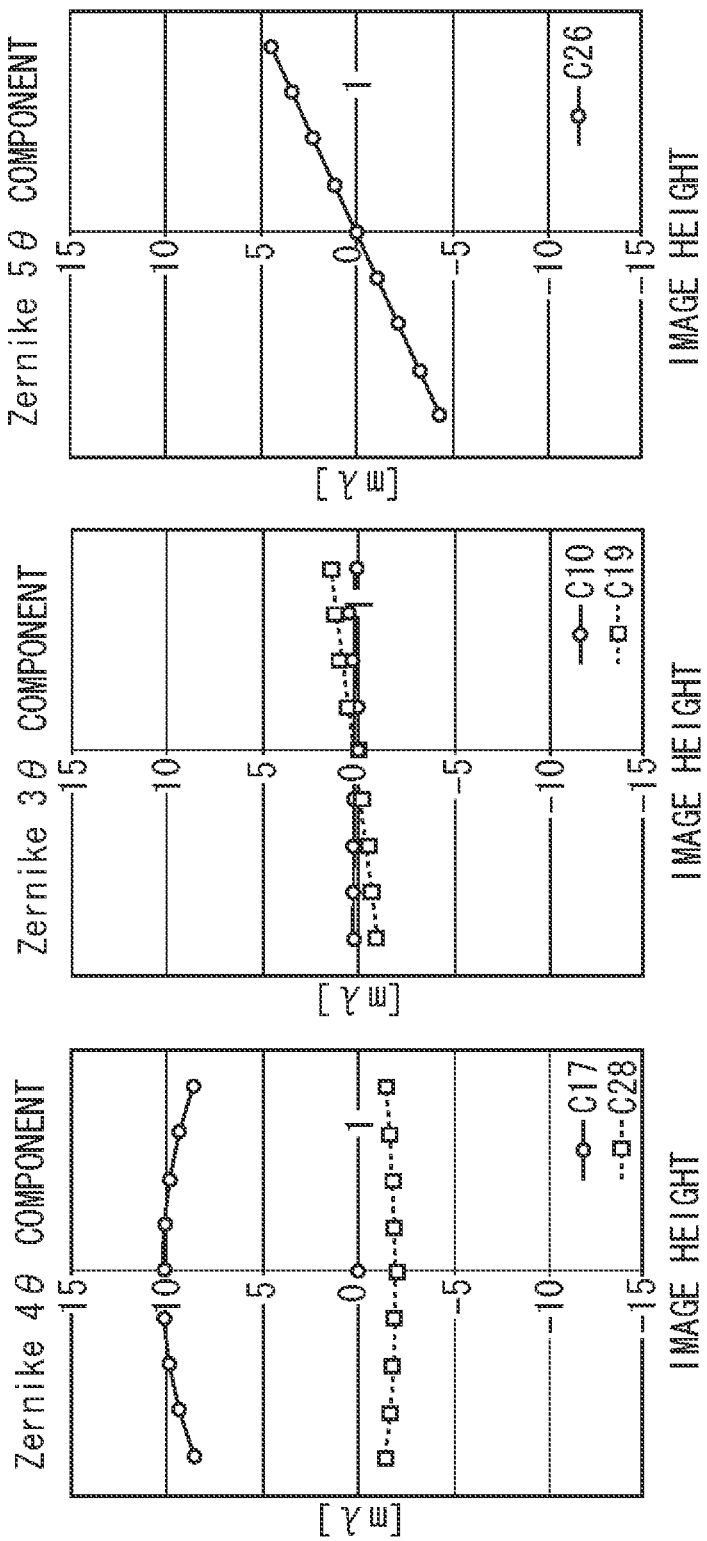
FIG. 5 is a view illustrating aberrations of the projection optical system which change when four actuators apply different forces to deform the first deformable optical element.

Further, FIG. 5 illustrates aberration changes when different forces are applied to the deformable optical element LE161 by the four actuators 203A to 203D to deform the deformable optical element LE161. At this time, the actuator 203A applies a force of 3.6 N, the actuator 203B applies a force of 0.54 N, the actuator 203C applies a force of 3.6 N, and the actuator 203D applies a force of 3.6 N, to the deformable optical element LE161. Comparing with FIG. 4, which illustrates the aberration changes when four actuators apply the same force to deform the deformable optical element LE161, it is found that generation rates of the 4-fold rotational symmetry aberration component, 3-fold rotational symmetry aberration component, and 5-fold rotational symmetry aberration component in the pupil are different.

Figure 6:
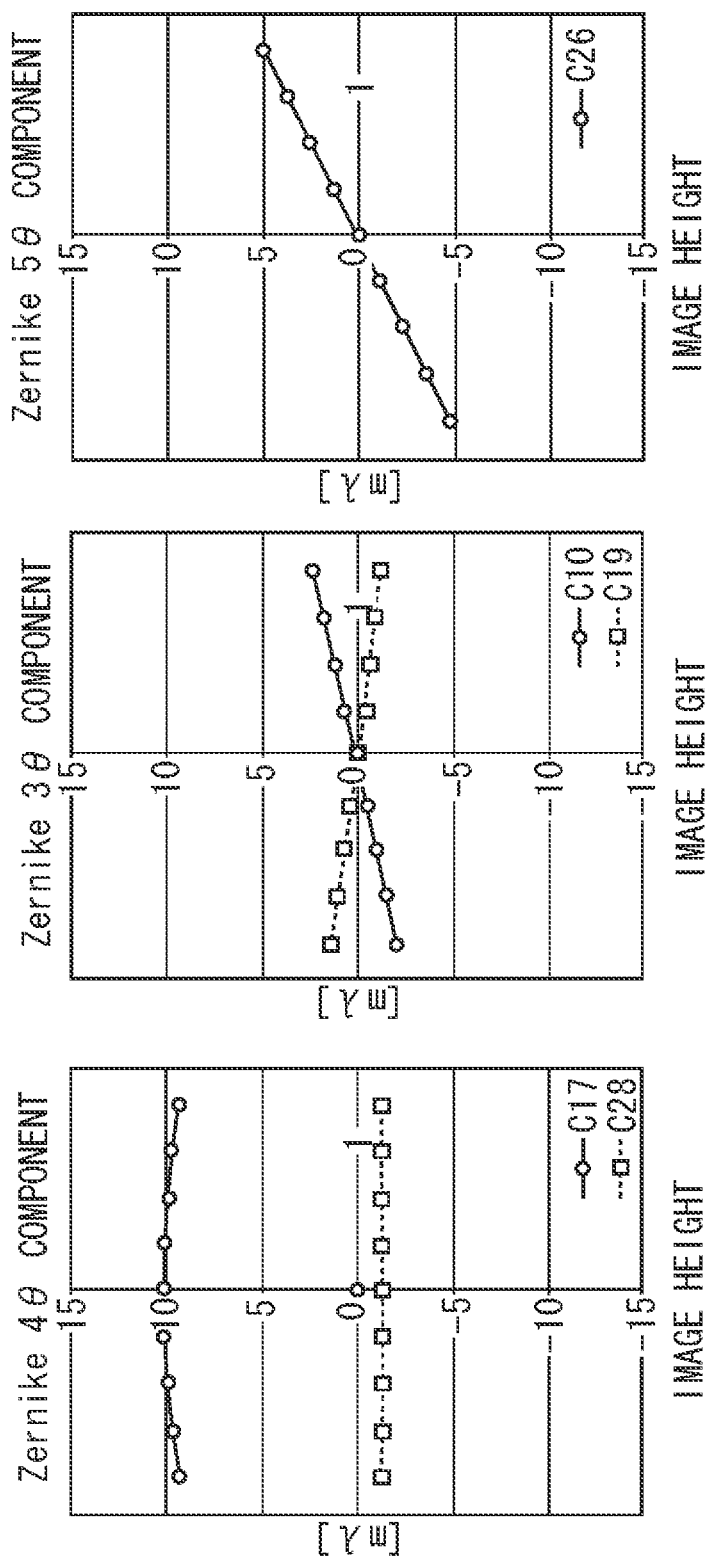
FIG. 6 is a view illustrating aberrations of the projection optical system which change when four actuators apply different forces to deform the first deformable optical element.

Further, FIG. 6 illustrates the aberration changes when the actuator 203A applies a force of 4.7 N, the actuator 203B applies a force of 2.4 N, the actuator 203C applies a force of 4.7 N, and the actuator 203D applies a force of −3.5 N, to the deformable optical element LE161. Comparing with FIGS. 4 and 5, it is found that the generation rates of the 4-fold rotational symmetry aberration component, 3-fold rotational symmetry aberration component, and 5-fold rotational symmetry aberration component in the pupil are different. In this way, lens deformation amounts of the actuators 203A to 203D are determined depending on the rate of each aberration component to be corrected.

Figure 7:
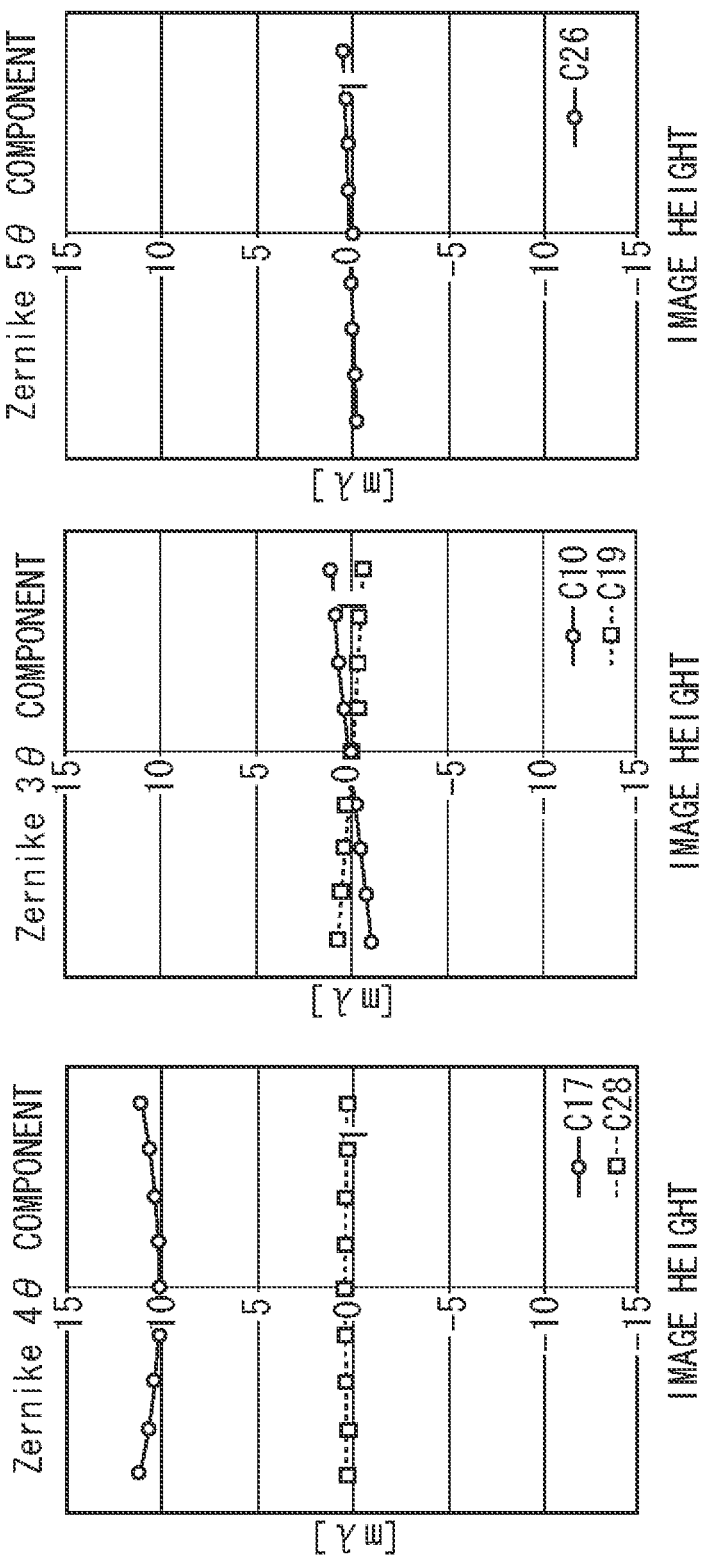
FIG. 7 is a view illustrating aberrations of the projection optical system which change when four actuators apply the same force to deform a second deformable optical element.

Next, consider a case in which, instead of LE161, LE162 is the deformable optical element. The deformable optical element LE162, which has EA/EA0 value of 0.98, is an optical element which does not satisfy the formula (1). FIG. 7 illustrates aberration change amounts when external forces are applied to the deformable optical element LE162 by the four actuators 203A to 203D arranged at four positions on the outer circumference, and the deformable optical element LE162 is deformed into 4-fold rotational symmetry. In this case, the higher-order symmetrical aberration components of the same image height of the 4-fold rotational symmetry aberration components C17, C28 in the pupil have changed. On the other hand, the higher-order asymmetrical aberrations of the 3-fold rotational symmetry aberration components C10, C19 in the pupil have hardly changed. Also, the higher-order asymmetrical aberration of the 5-fold rotational symmetry aberration component C26 in the pupil has hardly changed. As described above, even when deforming an optical element which does not satisfy the formula (1), the asymmetrical aberration in the pupil which depends on the image height cannot be corrected.

Figure 8:
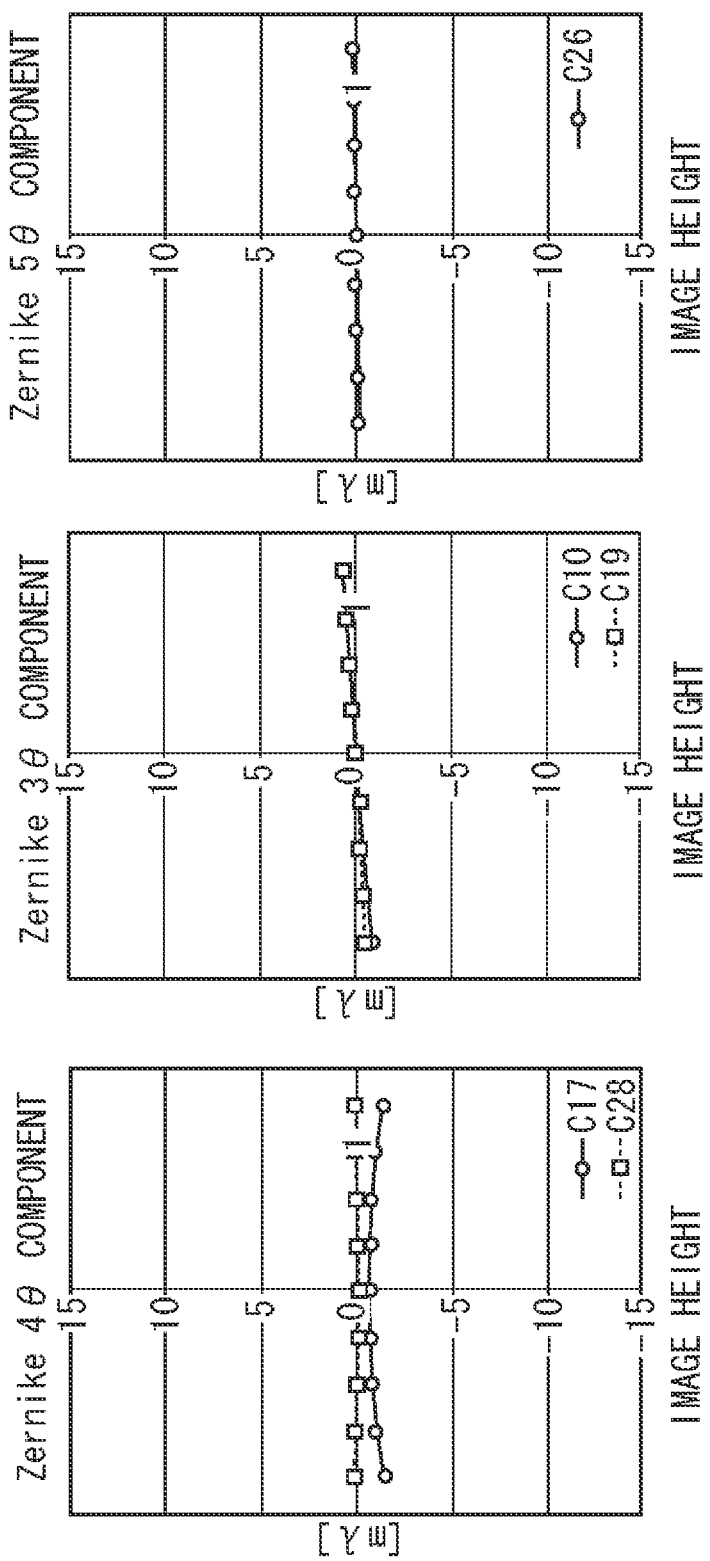
FIG. 8 is a view illustrating aberrations of the projection optical system which change when four actuators apply the same force to deform a third deformable optical element.

Next, consider a case in which, instead of LE161, LE163 is the deformable optical element. The deformable optical element LE163, which has EA/EA0 value of 0.72, is an optical element which does not satisfy the formula (1). FIG. 8 illustrates aberration change amounts when the same force of 2.1 N as that of LE161 is applied to each point by the actuators 203A to 203D and the deformable optical element LE163 is deformed into 4-fold rotational symmetry. When comparing with FIG. 4, which illustrates aberration changes when the deformable optical element LE161 is deformed into 4-fold rotational symmetry, the generation amounts of the 3-fold rotational symmetry aberration component, the 4-fold rotational symmetry aberration component, and the 5-fold rotational symmetry aberration component are small. This is because the light flux passing through the deformable optical element LE163 is small, and a high-order aberration component is difficult to be generated. Therefore, to correct the aberration of the projection optical system 16, a very large force has to be applied to the deformable optical element LE163 by the actuators 203A to 203D. In this case, a large stress-strain is generated in the deformable optical element LE163, and birefringence occurs in the deformable optical element LE163, so that the imaging performance of the projection optical system 16 deteriorates.

Next, a projection optical system according to a second exemplary embodiment of the present invention will be described. In the projection optical system according to the present exemplary embodiment, actuators are arranged at six positions on the outer circumference of the deformable optical element LE161 of the projection optical system 16 in FIG. 3. By applying external forces to the deformable optical element LE161 by the six actuators, the deformable optical element LE161 is deformed into 6-fold rotational symmetry.

The six actuators are arranged in the circumference direction of the deformable optical element LE161 in the same pitch of 60 degrees. In the center between each actuator, fixed ends are arranged at six positions in the same pitch. The configuration other than the above is the same as that of the mechanism in FIG. 2.

Figure 9:
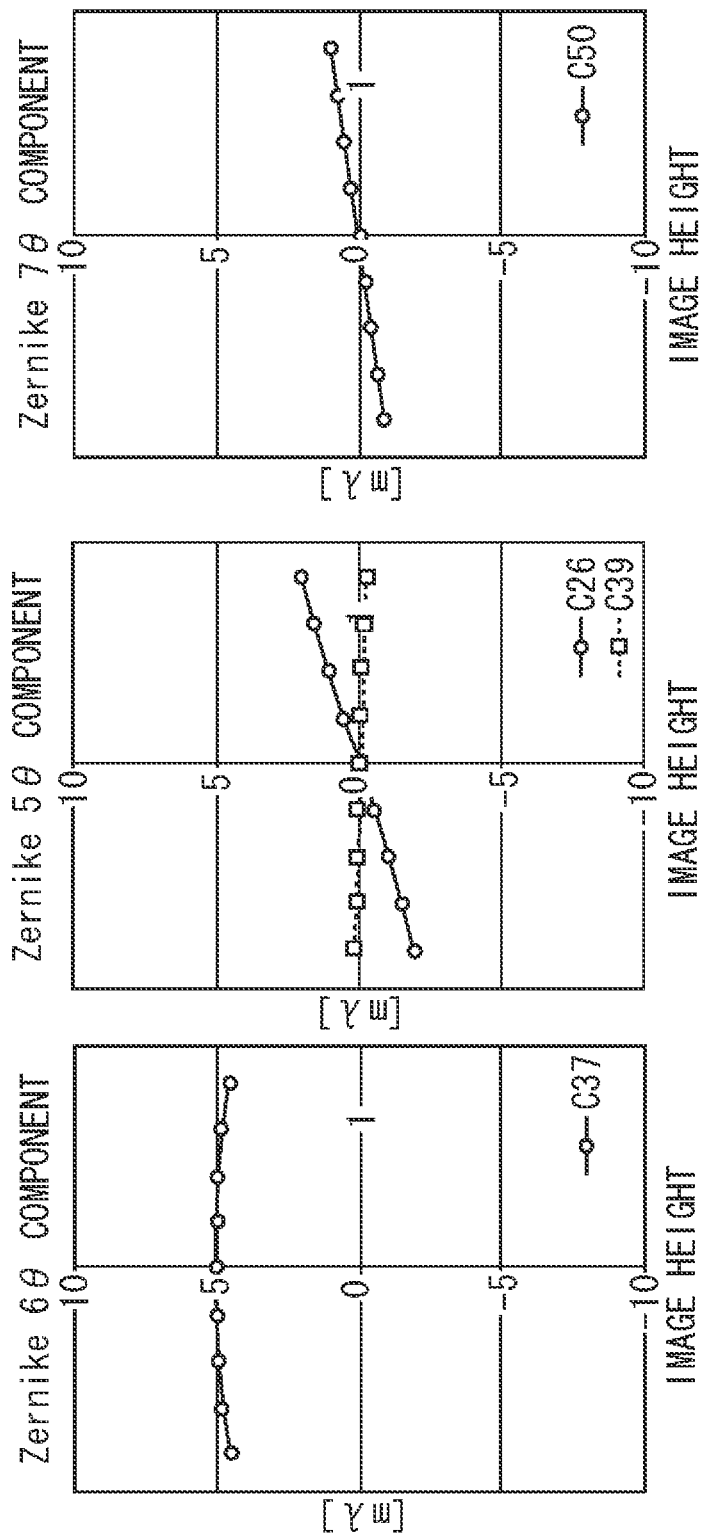
FIG. 9 is a view illustrating aberrations of the projection optical system which change when six actuators apply the same force to deform the first deformable optical element.

FIG. 9 illustrates aberration change amounts when a force of 9.3 N is applied to the deformable optical element LE161 by the six actuators and the deformable optical element LE161 is deformed into 6-fold rotational symmetry. In this case, the higher-order symmetrical aberration component of the same image height of the 6-fold rotational symmetry aberration component C37 in the pupil has changed. Also, the higher-order asymmetrical aberration components of the image height primary component of the 5-fold rotational symmetry components C26, C39 in the pupil have changed. Further, the higher-order asymmetrical aberration component of the image height primary component of the 7-fold rotational symmetry component C50 has changed. As described above, by deforming the deformable optical element LE161 into 6-fold rotational symmetry, it is possible to correct the same image height component of the 6θ component in the pupil, the image height primary component of the 5θ component in the pupil, and the image height primary component of the 7θ component in the pupil.

In the above exemplary embodiments, although, when applying different forces to the deformable optical element by a plurality of actuators, all the plurality of actuators are used to apply the forces to the deformable optical element, a part of actuators may not be used.

Next, a manufacturing method of a device (semiconductor device, liquid crystal display device, and the like) according to an exemplary embodiment of the present invention will be described. Here, a manufacturing method of a semiconductor device will be described as an example.

The semiconductor device is manufactured through a pre-process in which an integrated circuit is formed on a wafer and a post-process in which the integrated circuit chip formed on the wafer in the pre-process is completed as a product. The pre-process includes a process in which a wafer coated with a photosensitizing agent is exposed by using the above described exposure apparatus, and a process in which the wafer is developed. The post-process includes an assembly process (dicing, bonding), and a packaging process (chip encapsulation). The liquid crystal display device is manufactured through a process for forming a transparent electrode. The process for forming a transparent electrode includes a process for coating a glass substrate deposited with a transparent electrode film with a photosensitizing agent, a process for exposing the glass substrate coated with the photosensitizing agent by using the exposure apparatus described above, and a process for developing the glass substrate.

The device manufacturing method according to the present exemplary embodiment can manufacture a higher quality device than conventional methods.

Figure 10:
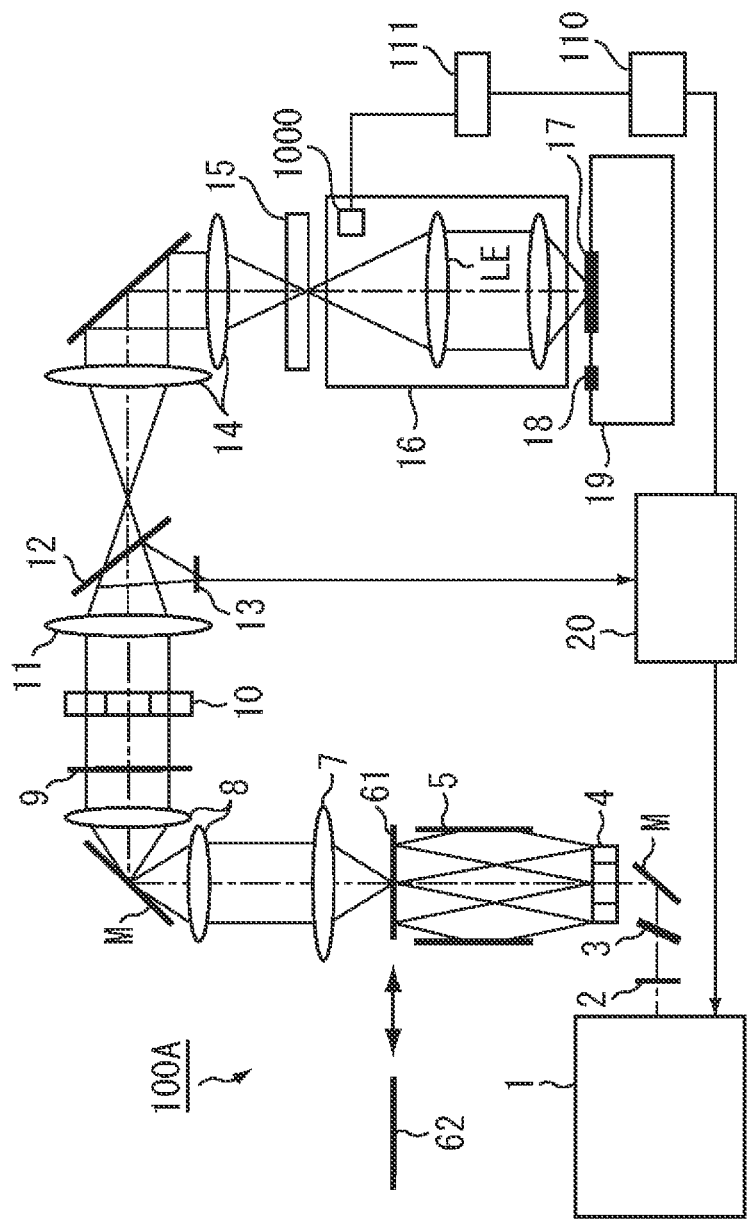
FIG. 10 is a view of an exposure apparatus according to another exemplary embodiment of the present invention.

In the exemplary embodiments described above, the aberration is corrected by deforming an optical element by using a deformation unit. However, as illustrated in FIG. 10, instead of the deformation unit, a heating unit 1000 may be provided. FIG. 10 is a view of an exposure apparatus 100A according to another exemplary embodiment of the present invention. In FIG. 10, the same reference numeral is given to the same member as that of the exposure apparatus illustrated in FIG. 1. As the heating unit 1000, for example, a light emitting unit for emitting light (for example, infrared rays) which does not expose a resist to the optical element can be used, and a technique as discussed in EP0823662(A2) or U.S. Pat. No. 5,805,273A can be used. By emitting infrared rays to the optical element by using the light emitting unit, a heat distribution can be given to the optical element. By giving the heat distribution to the optical element, a refractive-index distribution is generated in the optical element, so that the aberration of the projection optical system can be changed. By emitting infrared rays to an optical element satisfying the conditional formula (1) so that a refractive-index distribution of n-fold rotational symmetry is generated in the optical element, the same effect as that obtained by deforming the optical element into n-fold rotational symmetry can be obtained.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-042437 filed Feb. 25, 2009, which is hereby incorporated by reference herein in its entirety.

What is claimed is:

1. A system comprising:
    a plurality of optical elements;
    a deformation unit configured to deform a deformable optical element satisfying a following conditional formula included in the plurality of optical elements by applying a force to the deformable optical element:

$$0.75 < EA/EA0 < 0.95$$

where EA0 represents an effective aperture of each of the plurality of optical elements and EA represents an axial light flux diameter of each of the plurality of optical elements; and
        a control unit configured to control the deformation unit,
        wherein n positions on an outer circumference of the deformable optical element are fixed,
        wherein the deformation unit includes n actuators,
        wherein the n actuators apply forces to other n positions on the outer circumference,
        wherein the n actuators apply different forces to the deformable optical element,
        wherein the control unit reduces an aberration that depends on an image height of the system and an aberration that does not depend on the image height of the system at the same time by deforming the deformable optical element by using the deformation unit, and
        wherein the control unit is configured to determine a force to be applied to the deformable optical element by the n actuators according to an amount of an aberration component dependent on an image height.

2. The system according to claim 1, wherein the control unit reduces aberration components of (n−1)-fold rotational symmetry, n-fold rotational symmetry, and (n+1)-fold rotational symmetry in a pupil of the system by applying forces to the other n positions of the deformable optical element to deform the deformable optical element.

3. The system according to claim 1, wherein n is an even number.

4. The system according to claim 1, wherein the other n positions are arranged in a pitch of 360/n degrees.

5. The system according to claim 1, wherein the fixed n positions are arranged in a same pitch of 360/n degrees.

6. An apparatus comprising:
    an illumination system configured to illuminate an original plate with light from a light source; and
    a projection system configured to project a pattern image of the original plate onto a substrate, the projection system comprising:
        a plurality of optical elements;
        a deformation unit configured to deform a deformable optical element satisfying a following conditional formula included in the plurality of optical elements by applying a force to the deformable optical element:

$$0.75 < EA/EA0 < 0.95$$

where EA0 represents an effective aperture of each of the plurality of optical elements and EA represents an axial light flux diameter of each of the plurality of optical elements; and
        a control unit configured to control the deformation unit,
        wherein n positions on an outer circumference of the deformable optical element are fixed,
        wherein the deformation unit includes n actuators, wherein the n actuators apply forces to other n positions on the outer circumference,
wherein the n actuators apply different forces to the deformable optical element,
wherein the control unit reduces an aberration that depends on an image height of the projection system and an aberration that does not depend on the image height of the projection system at the same time by deforming the deformable optical element by using the deformation unit, and
wherein the control unit is configured to determine a force to be applied to the deformable optical element by the n actuators according to an amount of an aberration component dependent on an image height.

7. A method comprising:
exposing a substrate by using an exposure apparatus; and
developing the exposed substrate, the exposure apparatus comprising:
an illumination system configured to illuminate an original plate with light from a light source; and
a projection system configured to project a pattern image of the original plate onto the substrate, the projection system comprising:
a plurality of optical elements;
a deformation unit configured to deform a deformable optical element satisfying a following conditional formula included in the plurality of optical elements by applying a force to the deformable optical element:

$$0.75 < EA/EA0 < 0.95$$

where EA0 represents an effective aperture of each of the plurality of optical elements and EA represents an axial light flux diameter of each of the plurality of optical elements; and
a control unit configured to control the deformation unit,
wherein n positions on an outer circumference of the deformable optical element are fixed,
wherein the deformation unit includes n actuators,
wherein the n actuators apply forces to other n positions on the outer circumference,
wherein the n actuators apply different forces to the deformable optical element,
wherein the control unit reduces an aberration that depends on an image height of the system and an aberration that does not depend on the image height of the system at the same time by deforming the deformable optical element by using the deformation unit, and
wherein the control unit is configured to determine a force to be applied to the deformable optical element by the n actuators according to an amount of an aberration component dependent on an image height.

8. A system comprising:
a plurality of optical elements;
a deformation unit configured to deform a deformable optical element satisfying a following conditional formula included in the plurality of optical elements by applying a force to the deformable optical element:

$$0.75 < EA/EA0 < 0.95$$

where EA0 represents an effective aperture of each of the plurality of optical elements and EA represents an axial light flux diameter of each of the plurality of optical elements; and
a control unit configured to control the deformation unit,
wherein n positions on an outer circumference of the deformable optical element are fixed,
wherein the deformation unit includes n actuators,
wherein the n actuators apply forces to other n positions on the outer circumference,
wherein the n actuators apply different forces to the deformable optical element,
wherein the control unit is configured to determine a force to be applied to the deformable optical element by the n actuators according to an amount of an aberration component dependent on an image height, and
wherein the control unit reduces an $n\theta$ aberration component, an $(n-1)\theta$ aberration component and an $(n+1)\theta$ aberration component at the same time by deforming the deformable optical element by using the deformation unit.

9. The system according to claim 8, wherein the control unit reduces aberration components of $(n-1)$-fold rotational symmetry, n-fold rotational symmetry, and $(n+1)$-fold rotational symmetry in a pupil of the system by applying forces to the other n positions of the deformable optical element to deform the deformable optical element.

10. The system according to claim 8, wherein n is an even number.

11. The system according to claim 8, wherein the other n positions are arranged in a pitch of 360/n degrees.

12. The system according to claim 8, wherein the fixed n positions are arranged in a same pitch of 360/n degrees.

13. An apparatus comprising:
an illumination system configured to illuminate an original plate with light from a light source; and
a projection system configured to project a pattern image of the original plate onto a substrate, the projection system comprising:
a plurality of optical elements;
a deformation unit configured to deform a deformable optical element satisfying a following conditional formula included in the plurality of optical elements by applying a force to the deformable optical element:

$$0.75 < EA/EA0 < 0.95$$

where EA0 represents an effective aperture of each of the plurality of optical elements and EA represents an axial light flux diameter of each of the plurality of optical elements; and
a control unit configured to control the deformation unit,
wherein n positions on an outer circumference of the deformable optical element are fixed,
wherein the deformation unit includes n actuators,
wherein the n actuators apply forces to other n positions on the outer circumference,
wherein the n actuators apply different forces to the deformable optical element,
wherein the control unit is configured to determine a force to be applied to the deformable optical element by the n actuators according to an amount of an aberration component dependent on an image height, and
wherein the control unit reduces an $n\theta$ aberration component, an $(n-1)\theta$ aberration component and an $(n+1)\theta$ aberration component at the same time by deforming the deformable optical element by using the deformation unit.

14. A method comprising:
exposing a substrate by using an exposure apparatus; and
developing the exposed substrate, the exposure apparatus comprising:
an illumination system configured to illuminate an original plate with light from a light source; and a projection system configured to project a pattern image of the original plate onto the substrate, the projection system comprising:

a plurality of optical elements;

a deformation unit configured to deform a deformable optical element satisfying a following conditional formula included in the plurality of optical elements by applying a force to the deformable optical element:

$$0.75 < EA/EA0 < 0.95$$

where EA0 represents an effective aperture of each of the plurality of optical elements and EA represents an axial light flux diameter of each of the plurality of optical elements; and a control unit configured to control the deformation unit, wherein n positions on an outer circumference of the deformable optical element are fixed, wherein the deformation unit includes n actuators, wherein the n actuators apply forces to other n positions on the outer circumference, wherein the n actuators apply different forces to the deformable optical element, wherein the control unit is configured to determine a force to be applied to the deformable optical element by the n actuators according to an amount of an aberration component dependent on an image height, and wherein the control unit reduces an $n\theta$ aberration component, an $(n-1)\theta$ aberration component and an $(n+1)\theta$ aberration component at the same time by deforming the deformable optical element by using the deformation unit.

* * * * *